United States Patent [19]

Johnson

[11] Patent Number: 5,256,963
[45] Date of Patent: Oct. 26, 1993

[54] DIGITAL TESTING FOR HIGH-IMPEDANCE STATES IN DIGITAL ELECTRONIC CIRCUITS

[75] Inventor: Joseph F. Johnson, Boise, Id.

[73] Assignee: Micron Technology Inc., Boise, Id.

[21] Appl. No.: 608,575

[22] Filed: Nov. 2, 1990

[51] Int. Cl.$^5$ .................. G01R 31/28; G06F 11/00
[52] U.S. Cl. ................ 324/158 R; 324/73.1;
371/21.1; 371/21.2; 365/201
[58] Field of Search ........... 365/201, 189.11, 203;
324/158 R, 73.1; 371/21.1, 21.4, 15.1, 25.1;
437/8

[56] References Cited

U.S. PATENT DOCUMENTS

| | | | |
|---|---|---|---|
| 4,771,428 | 9/1988 | Acuff et al. | 324/73.1 |
| 4,811,299 | 3/1989 | Miyazawa et al. | 371/21.1 |
| 4,835,458 | 5/1989 | Kim | 324/158 R |
| 4,931,723 | 6/1990 | Jeffrey et al. | 324/158 R |
| 4,980,888 | 12/1990 | Bruce et al. | 371/21.1 |
| 4,991,175 | 2/1991 | Wilson | 371/15.1 |
| 4,994,732 | 2/1991 | Jeffrey et al. | 324/158 R |
| 5,051,995 | 9/1991 | Tobita | 371/21.1 |

*Primary Examiner*—Vinh Nguyen
*Attorney, Agent, or Firm*—Wells, St. John, Roberts, Gregory & Matkin

[57] ABSTRACT

Methods for testing digital electronic device terminals to identify high-impedance states from voltage-defined logic states driven by the digital device being tested. For example, the methods can be used to test a memory chip having a three-state signal terminal. The methods allow for detection of high-impedance states without analog voltage testing, such as by using merely a two-state logic testing apparatus. The methods include precharging the signal terminal to a precharge logic state voltage which is different from a selected logic state voltage. The device being tested is stimulated to produce a test signal state at the signal terminal. If the test state is variable between the high-impedance and the selected state, then maintaining the precharge voltage indicates that the signal terminal is in a high-impedance state.

27 Claims, 1 Drawing Sheet

DIGITAL TESTING FOR HIGH-IMPEDANCE STATES IN DIGITAL ELECTRONIC CIRCUITS

TECHNICAL FIELD

This invention relates to methods for testing terminals of digital electronic devices to properly determine high-impedance states from voltage-defined logic states, particularly methods for testing memory integrated circuits having one or more contact terminals which can assume high-voltage, low-voltage and high-impedance states.

BACKGROUND OF THE INVENTION

Digital electronic circuits generally employ two-state output terminals to convey binary logic information. Such two-state output terminals produce one of two output voltages: a relatively high-voltage, or a relatively low-voltage. These two discernable voltages define two possible binary logic states. The low-voltage defines a "0," "false," or "low" logic state. The high-voltage defines a "1," "true," or "high" logic state. A voltage corresponding to a "low" is defined to be below a first threshold voltage and a voltage corresponding to a "high" is defined to be above a second, higher, threshold voltage. A voltage between the first and second thresholds is not a valid logic state, and is avoided (except during transitions between valid states) by the specific operational parameters of the electronic devices formed in the integrated circuit or other digital circuitry.

Output terminals of digital circuitry, and integrated circuits in particular, can be constructed to produce a third state. This additional or third state is not defined by a voltage level, but instead is indicated by a high-impedance state at the signal terminal. Such a high-impedance signal state is assumed during certain operations or under specified conditions. For example, in memory integrated circuits a high-impedance state has been used on a data terminal to indicate failure during a testing mode of operation.

The high-impedance state or "tri-state" does not usually correspond to a logic state. In some memory chips, such a high-impedance state is useful where multiple data terminals are to be electrically connected to a common data bus. The memory of the associated computer control circuitry allows a single memory chip to operate while the data terminal of other chips are placed in a high-impedance state. Thus, multiple output terminals from numerous devices may be connected to a single input terminal, with control circuitry selecting which of the output terminals is to be active at any given time. However, the high-impedance signal state of a three-state signal terminal can also be used to convey information.

A dynamic random access memory integrated circuit (DRAM) is an example of one type of circuit which can be designed to use a three-state signal terminal to convey a third information state. This third, high-impedance state is in addition to high and low voltage logic states. During testing, a DRAM is put into a test mode to enable reading from and writing to a group of memory storage cells during a single read or write access cycle. In specific, during a single test mode write access cycle a known logic state is presented to a data input/output terminal of a DRAM. This state is written in parallel to a number of individual memory storage cells to speed testing. During an associated test mode read cycle, the logic states from each of the group of memory storage cells is read and internally compared within the integrated circuit. If they are identical, the logic state stored by the group of cells is produced at the data input/output terminal. Otherwise, a high-impedance state is produced.

Unfortunately, conventional two-state logic testing apparatus are not able to determine whether a signal terminal is producing a high-impedance state. The high-impedance state is not defined by a specific voltage or even a range of voltages. Because a terminal at a high impedance is effectively shut off from internal chip circuitry, the terminal may assume various voltages. The high-impedance terminal voltage may be limited by external factors such as external terminal biasing. Two-state logic testing apparatus have input terminals which are only capable of determining whether a voltage corresponds to a low or a high logic state. Since the voltage of a high-impedance terminal may assume various voltages, and the two-state logic tester cannot indicate an invalid voltage, direct detection of a high-impedance output state is impossible using a two-state testing apparatus.

To test such three-state circuits more expensive and complicated testing equipment has previously been necessary. Instead of using relatively less expensive two-state comparative digital testing devices, it has been necessary to use complicated analog circuit testing equipment which must be accurate to more specific voltages. The analog testers use additional circuitry referred to as window detectors to make the correct determination of the high-impedance state. A window detector is an analog comparator circuit which determines whether a voltage at a signal terminal is within a specified analog range. The window detector determines whether the voltage at the signal terminal is between the high and low thresholds. Such analog window-detection testing equipment has been used by externally biasing a three-state signal terminal to a middle voltage between the logic thresholds. Output of high and low logic states during testing overcomes the applied middle or intermediate voltage bias thus causing the terminal to assume the appropriate logic state voltage. Output of a high-impedance signal state results in the terminal maintaining the intermediate voltage which is detected by the relatively more complicated analog testing equipment. Presence of the intermediate voltage at the signal terminal thus indicates the high-impedance state.

Window detectors and analog test circuitry are relatively more expensive than digital, two-state test equipment. Semiconductor manufacturers and others continue to have a strong need for improved testing techniques involving circuits with terminals which assume high-impedance states. Testing is a significant part of integrated circuit manufacture. In high capacity memory chips this occurs because millions of cells must be tested in each chip to assure accurate data storage and retrieval. The current invention is a substantial improvement in the art of testing of digital devices which include digital terminals having a high-impedance output state.

BRIEF DESCRIPTION OF THE DRAWINGS

One or more preferred embodiments of the invention are illustrated in the accompanying drawings, which are briefly described below.

DETAILED DESCRIPTION OF THE PREFERRED EMBODIMENTS

This disclosure of the invention is submitted in furtherance of the constitutional purposes of the Patent Laws "to promote the progress of science and useful arts" (Article 1, Section 8).

Figure 1:
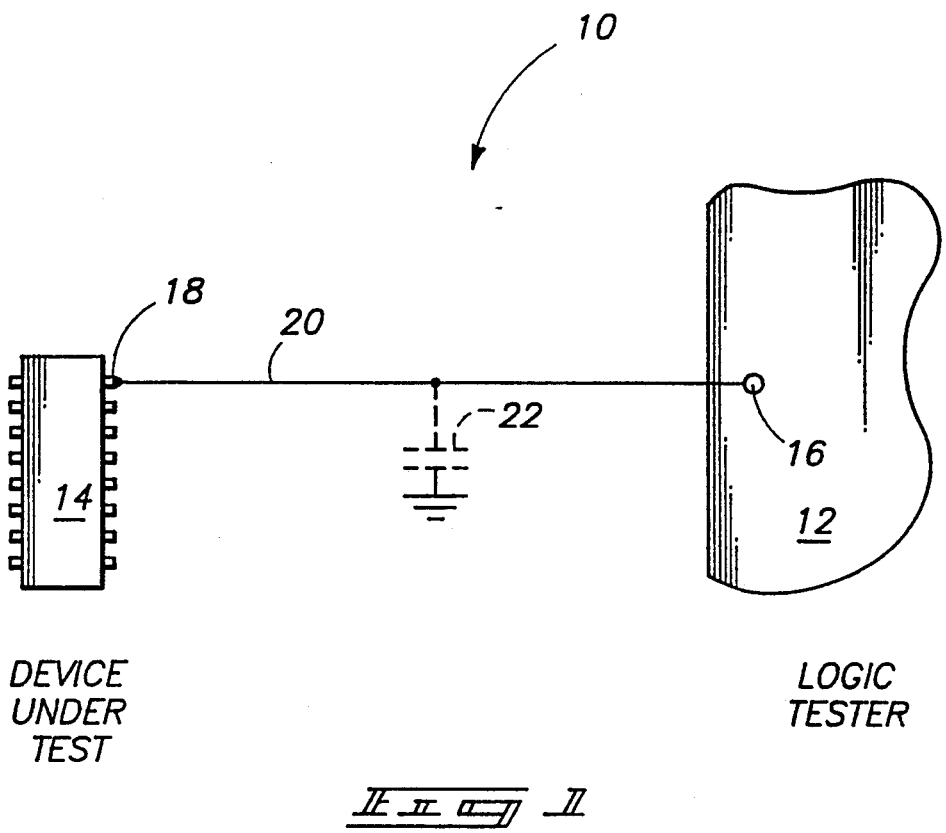
FIG. 1 is an electrical schematic diagram of a testing circuit. The diagram shows a digital logic tester connected to a dynamic random access memory integrated circuit.

FIG. 1 shows a test circuit or system 10 for testing a digital electronic device 14 using methods according to this invention. As shown, test circuit 10 includes a digital logic tester 12 which is connected to test a dynamic random access memory integrated circuit (DRAM) 14.

A preferred semiconductor dynamic random access memory integrated circuit 14 includes a data input-output terminal 18 which is a variable three-state signal terminal. Alternatively, the terminal 18 can be a dedicated output terminal. The three-state signal terminal is variable between voltage-defined high and low voltages, and a high-impedance state. Memory integrated circuit 14 has a plurality of memory storage cells (not shown) which can be written to during a write cycle of operation. The memory cells can also be read during a read cycle of operation. Typical testing by tester 12 involves first writing to one or more cells, followed by reading the same cell or cells to determine if the appropriate bit has been stored and retrieved.

The state at terminal 18 can assume a high-impedance condition as a result of internal chip circuitry. For example the internal circuitry of the chip can produce a high-impedance state if one of several cells being written into and read in a parallel simultaneous fashion produces a deviant bit not consistent with the stored and retrieved bits from the other parallel memory cells.

Logic tester 12 can be selected from a variety of two-state or binary logic testing apparatus having conventional comparative digital circuitry known in the art. Logic tester 12 is advantageously selected from testing apparatus having only binary testing capability. When used according to the novel methods of this invention, tester 12 need not be capable of window detection of voltages intermediate or outside typical voltage ranges used to define the two binary states. Tester 12 also does not need the ability to measure analog voltages over a range encompassing the voltages defining the two binary logic states. An example of a suitable logic tester is an Intersect model 10-120 memory evaluation system, available from Reliability, Inc. of Houston, Tex. Alternative binary testing apparatus, such as custom-designed or other specialized test circuitry can, if suitably constructed, also be used to practice novel methods according to this invention.

Logic tester 12 has a two-state testing terminal 16 for electrical connection to an appropriate signal terminal or terminals 18 of the digital device 14 being tested. Testing terminal 16 is shown connected to signal terminal 18 using a testing bus 20 which can be any appropriate conductor. As shown, testing terminal 16 is advantageously connected to the remaining circuitry of testing apparatus 12 so as to function as both a testing output terminal and a testing input terminal. When terminal 16 functions as an output terminal it generates a digital signal which is supplied to the device under test 14. In the case of a memory chip, the digital signal output from tester 12 can be written into the memory array. When terminal 16 functions as a testing input terminal it serves to sense the state on bus 20 and hence the output state existent on the signal terminal 18 of device 14. In the case of a memory chip the terminal 18 can detect the state of one or more cells which have been read.

Although the testing system shown in FIG. 1 indicates that terminal 16 serves both output and input functions, it is equally appropriate for the testing output signal from tester 12 to be from a single terminal which does not serve as the sensing or testing input terminal. A different terminal of tester 12 in such an alternative system will serve as the sensing or input terminal. The particular configuration will depend upon the internal logic of the device under test and the terminals provided thereon.

Additional control circuitry and electrical connections (not shown) can be connected between the logic tester 12 and the device under test 14. Such control circuitry and connections can be used to control and activate other operational control terminals of the memory integrated circuit 14, or other device under test. These additional terminal connections control operation, such as whether the chip operates to read from or write to the memory cells, and which cells are being written into or read from. For memory circuits such as memory integrated circuit 14, tester 12 typically controls a chip enable signal, write enable signal, output enable signal, address signals, and various other timing and control signals. These signals may be controlled to initiate and conduct both read and write cycles. Since the details of read and write cycles may vary according to the specific chip being tested, connections and timing details are neither shown nor described herein. Such details are specifically determined by reference to the manufacturers' specifications for the particular chip or other device being stimulated or activated to produce the tested signal.

Test circuit 10 is useful when operated according to the novel methods described herein to determine whether signal terminal 18 of the digital electronic device under test produces a voltage-defined selected logic state or a high-impedance state. The voltage-defined selected logic state may be a known logic state which has been previously defined, such as by being written to the electronic device. Alternatively, the selected logic state may be produced simply by suitable stimulation or operation of the device under test. The high-impedance state of signal terminal 18 does not have a defined voltage produced by the device under test.

Figure 2:
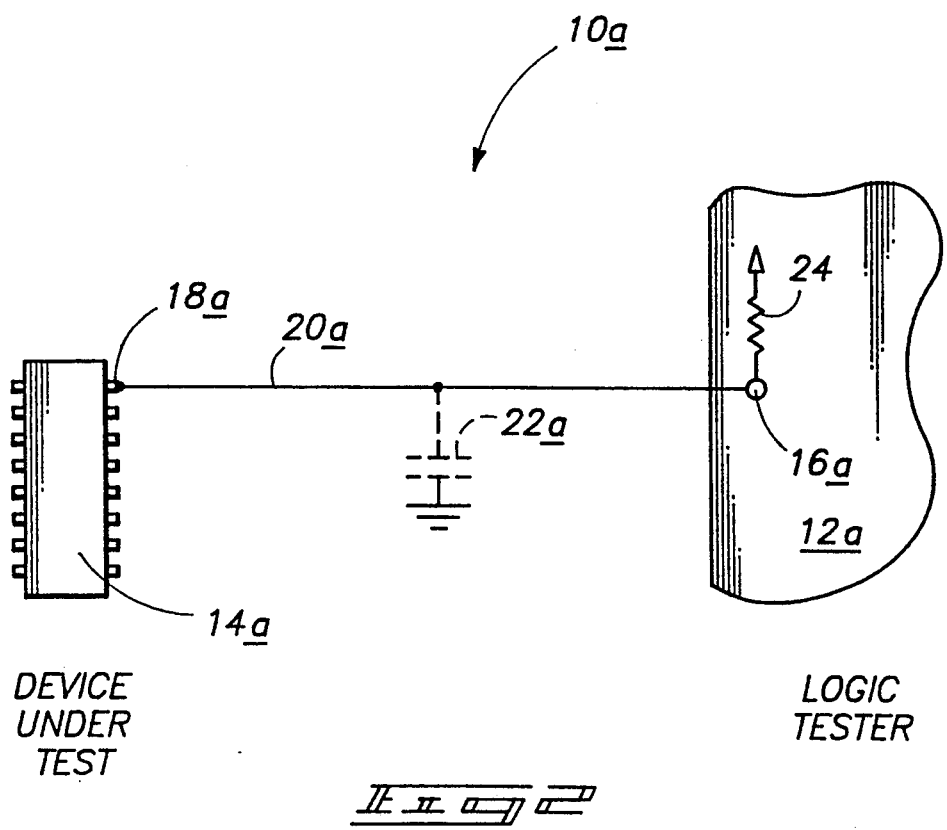
FIG. 2 is an electrical schematic diagram of a testing circuit similar to FIG. 1. The digital logic tester of FIG. 2, however, has a biased testing terminal.

FIG. 2 shows an alternative test circuit 10a which can be used to perform novel methods according to this invention. Test circuit 10a includes a logic tester 12a which is connected to test memory chip 14a or other desired digital device under test. Test circuit 10a is distinctive from test circuit 10 in that a biasing resistor 24 is shown connected from testing terminal 16a to a suitable reference voltage. The bias voltage provided via biasing resistor 24 thus biases testing terminal 16a to a desired voltage, such as a high logic state. While biasing the testing terminal to a logic state is not necessary, such biasing is an inherent feature of some logic testers. Methods according to this invention can be used to test device 14a even though the testing circuit includes a voltage bias. Otherwise, the testing circuits 10 and 10a of FIGS. 1 and 2 are similar. Accordingly, the following description will primarily address the circuit of FIG. 1 with reference made to FIG. 2 where necessary or appropriate. Common components of test circuits 10 and 10a have been labeled using the same numeric portion of the reference numeral, with an additional "a" used in FIG. 2 for unique identification.

FIGS. 1 and 2 also show electrical capacitances 22 and 22a in phantom. Capacitances 22 and 22a are associated with testing buses 20 and 20a, data terminal 18 and 18a, and testing terminal 16 and 16a, respectively. Bus capacitances 22 and 22a are shown in phantom lines to indicate that they are principally used to indicate capacitances that are inherent in conductors and electronic circuitry in direct electrical connection with testing bus 20 and bus 20a. Capacitances 22 and 22a can also represent discrete or other capacitors included in addition to the inherent capacitances of the systems.

The methods of this invention and the associated test setups are useful for testing digital electronic devices having one or more voltage-defined logic states and a high-impedance state. Novel methods according to the invention typically will be used to test a three-state signal terminal which is variable between high-voltage, low-voltage, and high-impedance signal states. The methods of this invention are also advantageous where one or two possible signal states is a high-impedance state.

Methods according to this invention are also particularly useful for performing a write-read test cycle for certain types of DRAM's. Such DRAM's are expected to produce a signal state at a signal terminal. The signal state can correspond to a logic state which was written to the particular cell or group of parallel cells of the DRAM being tested. Alternatively, the signal state can represent the condition or operation of one or more memory cells. Any other signal state, such as a high impedance or a logic state complementary to the written logic state, indicates an error. However, since the high-impedance state is voltage indeterminate, it is not possible to determine the presence of the high-impedance state using prior art techniques and relatively simple binary logic testers.

Methods according to this invention include electrically connecting at least one testing terminal of a logical testing apparatus to a signal terminal of the digital device being tested. The logical testing apparatus is electrically connected to allow determination of the logical state as defined by the voltage existing on the signal terminal of the digital device under test. In the case of testing memory chip 14, the methods of this invention include electrically connecting testing terminal 16 to data terminal 18 of memory integrated circuit 14 as shown. The connection between testing terminal 16 and data terminal 18 forms test bus 20. Bus capacitance 22 is associated with data terminal 18, testing terminal 16 and test bus 20.

Methods according to this invention further include precharging the signal terminal of the device being tested. Such precharging involves charging the signal terminal to a precharge logic state voltage which defines a precharge logic state. The precharging step is performed at a voltage which is appropriate to produce a precharge logic state which is logically different from a selected logic state. The selected logic state is a voltage-defined logical state which the signal terminal is capable of assuming. For example, if memory chip 14 is expected to produce a low voltage state, then precharging would be done at a relatively high voltage which defines the complementary high voltage state. Alternatively, if memory chip 14 is expected to produce a high voltage state, then precharging would be done at a relatively low voltage which defines the complementary low voltage state.

Methods according to this invention also include stimulating or activating the digital device being tested to produce an output or test signal state at the signal terminal. The stimulating step can be accomplished in any of various ways which are particular to the integrated circuit or other digital device being tested. For example, the memory chip 14 can be stimulated by supplying appropriate voltages to one or more terminals to cause a read cycle to be performed. Such read cycle will result in a state being assumed at the signal terminal, such as at terminal 18. Other types of digital circuits may be stimulated by providing one or more stimulating electrical activation signals to one or more activation terminals on the circuit thereby causing the signal terminal to produce a test output signal.

Methods of this invention further include determining whether the signal terminal has achieved the selected logic state or maintained the precharge logic state. This step of determining is advantageously accomplished by detecting the logical state of the signal terminal. This detecting can be accomplished using typical comparative logical testing apparatus which need not produce an analog determination of the signal voltage at the signal terminal. If the step of determining the logical state at the signal terminal results in a determination that the selected voltage-defined logical state has been assumed, then the device under test is known to have actively changed the voltage on the signal terminal from the precharge logic state voltage to the selected logic state voltage. Such a determination allows for concluding that the signal terminal is producing the selected logic state.

If the step of determining the logical state at the signal terminal results in a determination that the precharge logic state voltage has been maintained, then the device under test has either produced a high-impedance state or an active logic state which has a voltage range definition which is similar to or the same as the precharge logic state voltage. If the device under test can only produce either a high-impedance state and the selected logical state, then a determination that the precharge logic state has been maintained on the signal terminal allows for concluding that the signal terminal is in a high-impedance state.

Preferred methods according to this invention advantageously include stopping the precharging step prior to said determining step. The precharging is preferably stopped prior to the determining step to minimize the risk that precharging could provide sufficient current to prevent active change of the logical state on the signal terminal even though the device under test may be producing a signal state which is different from the precharge logical state.

The novel testing methods according to this invention also preferably entail stopping the precharging prior to said stimulating step. Precharging is preferably stopped prior to stimulating so that testing can proceed in an expeditious manner without the requirement that the device under test be capable of overcoming the current available via the precharging which is performed to precharge the signal terminal to the desired precharge logical state.

Novel methods according to this invention also preferably include delaying a read delay interval between starting said stimulating step and initiating said determining step. The read delay interval is variable depending upon the specifics of the testing system and the electrical capacitances and currents provided during the testing methodology. Delaying an appropriate read delay interval helps to assure that any active voltage-defined output through the signal terminal is capable of changing the degree of charge on the signal terminal prior to the determining step. For example, the read delay interval will allow the selected logic state voltage to be charged onto the testing bus from the device under test. If the capacitance 22 on the testing bus is high then a relatively long read delay interval is desired to allow current to flow to or from the test bus and achieve the signal voltage which is actively being produced by the device under test. Conversely, if the capacitance 22 is relatively low, then the output of an active signal on the signal terminal of the device being tested will provide relatively prompt change in the voltage on the signal terminal. In such a case the read delay interval only needs to be relatively short in order to effectuate accurate determination of the logical state on the signal terminal. The specific read delay interval needed will vary dependent upon both the capacitance of the testing bus, and the minimum current available from the active state which the signal terminal can assume.

The time required for a low-impedance logic state to establish itself on testing bus 20 is termed an active bus delay time. If signal terminal 18 presents a high-impedance state, then the precharge logic state will be stored on testing bus 20 by bus capacitance 22 for a relatively long duration, termed an inactive bus storage time.

Bus biasing, sometimes introduced at the testing terminal, may significantly shorten the inactive bus storage time by reducing the impedance of testing terminal 16. In many logic testers, bus biasing is minimal or nonexistent. However, if bus biasing is significant, as shown in FIG. 2, the inactive bus storage time may become sufficiently short so as to preclude a practical read delay interval. If this is the case, then the read delay interval may be lengthened by connecting discrete capacitors to testing bus 20 to intentionally increase bus capacitance 22. The value of the discrete capacitance, connected between testing bus 20 and ground, must be such as to guarantee that the total bus capacitance is sufficient to extend the inactive bus storage time beyond the minimum read delay interval.

The invention further includes novel methods for testing integrated circuit memory chips which include one or more signal terminals which are variable between at least a selected logic state having a selected logic state voltage, and a high-impedance state. The methods for testing integrated circuit memory chips can be accomplished without analog voltage measuring equipment or similar window detectors. The novel methods allow testing of such memory chips using standard binary or other appropriate digital testing apparatus which need only be capable of determining the logical state produced on the output signal terminal or terminals of the memory chip being tested.

Such methods for testing of memory chips advantageously include writing or otherwise producing a logical write data signal which is written to one or more of the memory cells within the memory chip being tested. The logical write data signal is written into the memory chip by appropriately activating the memory chip in a write activation control step or steps which cause the write data signal supplied to the memory chip to be written to one or more memory cells.

The methods for testing memory chips also include precharging the output signal terminal or terminals of the memory chip which are being tested. These signal terminals are precharged to a desired precharge logical state defined by an acceptable range of precharge logic state voltages. The precharge logic state is logically different from a selected logical state which is expected as one of the possible logical states which the signal terminal or terminals of the memory chip can assume. The selected logical state will be the data bit value of the cell being tested or some other signal state which is indicative of the conditions or operations of one or more cells.

The novel methods for testing memory chips also includes reading or otherwise activating the memory chip to produce a read data signal or other suitable signal state which is output and thus becomes a test signal state for the signal terminal being tested or some other signal state which is indicative of the condition or operation of one or more cells. The test signal state is stimulated after the signal terminal or terminals of the memory chip have been precharged to the precharge logic state voltage. The stimulating step results in the outputting of a signal terminal test state which is variable between at least a single voltage-defined logical state which is termed the selected logical state, and a high-impedance state.

The methods for testing memory chips also include determining or detecting the logical state developed at the signal terminal or terminals. If the logical state at the signal terminal is the precharge logic state, then the signal terminal is either in a high-impedance state or an active voltage-defined logical state equivalent to the precharge logical state. The methods can thus further include concluding that the signal terminal is in a high-impedance state if the signal terminal is not capable of outputting an active precharge logical state. If the logical state at the signal terminal is the selected logic state, then the memory chip has overcome the precharge and has actively charged the signal terminal to the selected logical state. The novel methods can thus further be defined to include concluding that the signal terminal is producing the selected logic state if the signal terminal is stimulated and achieves the selected logic state voltage.

The novel memory chip testing methods of this invention also preferably include stopping the precharging prior to said stimulating step. Precharging is preferably stopped prior to stimulating so that testing can proceed in an expeditious manner without the requirement that the memory chip under test be capable of overpowering the current available via the precharging.

Novel memory chip testing methods according to this invention also preferably include delaying a read delay interval between starting said stimulating step and initiating said determining step. The read delay interval is variable depending upon the specifics of the testing system and the electrical capacitances and currents provided during the testing methodology. Delaying an appropriate read delay interval helps to assure that any active voltage-defined output to the signal terminal is capable of changing the degree of electrical charge on the signal terminal prior to the determining step. For example, the read delay interval will allow the selected logic state voltage to be charged onto the testing bus from the device under test. If the capacitance 22 on the testing bus is high then a relatively long read delay interval is desired to allow current to flow to or from the test bus and achieve the signal voltage which is actively being produced by the device under test. Conversely, if the capacitance 22 is relatively low, then the output of an active signal on the signal terminal of the device being tested will provide relatively prompt change in the voltage on the signal terminal. In such a case the read delay interval only needs to be relatively short in order to effectuate accurate determination of the logical state on the signal terminal. The specific read delay interval needed will vary dependent upon both the capacitance of the testing bus, and the minimum current available from the active state which the signal terminal can assume.

The novel testing methods for memory chips as described herein can advantageously be carried out by performing the above-described testing steps upon a single cell or single group of parallel cells, and then going on to the next cell or group of cells after the first has been tested. Alternatively, it is possible to write into a plurality of cells or cell groups followed by independent precharging, stimulating (reading), determining and concluding steps. The methods can be used with integrated circuits which have internal analytical circuits which determine the state or condition of numerous cells and then provide one or more output signals which can potentially assume high impedance and one or more voltage-defined logical states.

In compliance with the statute, the invention has been described in language more or less specific as to methodological features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A method for testing a digital electronic memory chip using a binary logic testing apparatus to determine whether a signal terminal of the memory chip produces a selected logic state or a high-impedance state, the selected logic state being defined by a selected logic state voltage, the method comprising:
   precharging the signal terminal to a precharge logic state voltage which defines a precharge logic state, said precharge logic state being logically different from said selected logic state;
   stimulating the memory chip to produce a test signal state at the signal terminal which is variable between said selected logic state and said high-impedance state;
   determining a logical state existing at the signal terminal using the binary logic testing apparatus to determine whether the signal terminal is in the selected logic state or the high impedance state;
   concluding that the signal terminal is producing the selected logic state if the selected logic state exists thereat, and that the signal terminal is producing the high-impedance state if the precharge logic state exists thereat.

2. A method according to claim 1 and further defined by stopping the precharging prior to said stimulating.

3. A method according to claim 1 and further defined by stopping the precharging prior to said determining.

4. A method according to claim 1 and further defined by:
   stopping the precharging prior to said stimulating; and
   delaying a read delay interval between starting said stimulating and said determining.

5. A method according to claim 1 and further defined by:
   stopping the precharging prior to said stimulating; and
   delaying a read delay interval between starting said stimulating and said determining to allow said signal terminal to charge its associated electrical capacitance.

6. A method according to claim 1 and further defined by delaying a read delay interval between starting said stimulating and said determining, the read delay interval being appropriate to allow said signal terminal to charge associated electrical capacitance to the selected logic state voltage during the read delay interval if the signal terminal produces the selected logic state and to allow the precharge logic state voltage to be stored by said electrical capacitance during the read delay interval if the signal terminal produces a high-impedance state.

7. A method for testing an electronic digital circuit to determine whether a signal terminal of said digital circuit produces a selected logic state or a high-impedance state, the selected logic state being defined by a selected logic state voltage, the method comprising:
   precharging the signal terminal to a precharge logic state voltage which defines a precharge logic state, said precharge logic state being logically different from said selected logic state;
   stimulating the electronic digital circuit to produce a test signal state at the signal terminal which is variable between said selected logic state and said high-impedance state; and
   determining a logical state existing at the signal terminal to determine whether the signal terminal is in the selected logic state or the high impedance state.

8. A method according to claim 7 and further defined by concluding that the signal terminal is producing the selected logic state if the selected logic state is determined in said determining step, or that the signal terminal is producing the high-impedance state if the precharge logic state is determined in said determining step.

9. A method according to claim 7 and further defined by stopping the precharging prior to said stimulating.

10. A method according to claim 7 and further defined by stopping the precharging prior to said determining.

11. A method according to claim 7 and further defined by:
   stopping the precharging prior to said stimulating; and
   delaying a read delay interval between starting said stimulating and said determining.

12. A method according to claim 7 and further defined by:
   stopping the precharging prior to said stimulating; and
   delaying a read delay interval between starting said stimulating and said determining to allow said signal terminal to charge its associated electrical capacitance.

13. A method according to claim 7 and further defined by delaying a read delay interval between starting said stimulating and said determining, the read delay interval being appropriate to allow said signal terminal to charge its associated electrical capacitance to the selected logic state voltage during the read delay interval if the signal terminal produces the selected logic state and to allow the precharge logic state voltage to be stored by said electrical capacitance during the read delay interval if the signal terminal produces a high-impedance state.

14. A method for testing a digital electronic memory chip to determine whether a signal terminal thereof produces a selected logic state or a high-impedance state, the selected logic state being defined by a selected logic state voltage, the method comprising:
precharging the signal terminal to a precharge logic state voltage which defines a precharge logic state, said precharge logic state being logically different from said selected logic state;
simulating the memory chip to produce a test signal state at the signal terminal which is variable between said selected logic state and said high-impedance state;
determining a logical state existing at the signal terminal to determine whether the signal terminal is in the selected logic state or the high impedance state;
concluding that the memory chip is producing the selected logic state if the selected logic state exists at the signal terminal, or is producing the high-impedance state if the precharge logic state exists at the signal terminal.

15. A method according to claim 14 and further defined by stopping the precharging prior to said stimulating.

16. A method according to claim 14 and further defined by stopping the precharging prior to said determining.

17. A method according to claim 14 and further defined by:
stopping the precharging prior to said stimulating; and
delaying a read delay interval between starting said stimulating and said determining.

18. A method according to claim 14 and further defined by:
stopping the precharging prior to said stimulating; and
delaying a read delay interval between starting said stimulating and said determining to allow said signal terminal to charge its associated electrical capacitance.

19. A method according to claim 14 and further defined by delaying a read delay interval between starting said stimulating and said determining, the read delay interval being appropriate to allow said signal terminal to charge its associated electrical capacitance to the selected logic state voltage during the read delay interval if the signal terminal produces the selected logic state and to allow the precharge logic state voltage to be stored by said electrical capacitance during the read delay interval if the signal terminal produces a high-impedance state.

20. A method for testing an electronic digital circuit to determine whether a signal terminal which is connected to said digital circuit produces a high-impedance state as compared to at least one selected logic state that is defined by a selected logic state voltage, the method comprising:
precharging the signal terminal to a precharge logic state voltage that defines a precharge logic state, said precharge logic state being logically different from said selected logic state;
stopping said precharging;
thereafter stimulating the electronic digital circuit to produce a test signal state at the signal terminal which is variable between at least said selected logic state and said high-impedance state;
waiting a suitable read delay interval after said stimulating to allow said signal terminal to assume the selected logic state voltage if said signal terminal is producing said selected logic state as a result of said stimulating;
determining a logical state existing at the signal terminal to determine whether the signal terminal is in the selected logic state or the high impedance state.

21. A method according to claim 20 and further defined by concluding that the signal terminal is producing the selected logic state if the selected logic state voltage exists thereat, or that the signal terminal is producing the high-impedance state if the selected logic state voltage does not exist thereat.

22. A method according to claim 20 and further wherein the read delay interval is appropriate to allow the precharge logic state voltage to be stored by electrical capacitance associated with the signal terminal during the read delay interval if the signal terminal produces a high-impedance state.

23. A method of testing whether an electronic signal terminal produces a selected logic state while insuring that the selected logic state will not be present at the signal terminal if the signal terminal produces a high-impedance state, the method comprising:
precharging the signal terminal to a precharge logic state, said precharge logic state being different from the selected logic state;
producing a test signal state at the signal terminal; and
determining a logical state existing at the signal terminal to determine whether the signal terminal is in the selected logic state or the high impedance state.

24. A method according to claim 23 and wherein the test terminal is a two-state input/output terminal and the step of precharging comprises setting the test terminal to produce a voltage corresponding to the precharge logic state before the step of producing the test signal state.

25. A method according to claim 23, further comprising electrically connecting the signal terminal to a test terminal to form a testing bus and wherein:
the precharging is stopped before producing the test signal state;
the time interval between stopping the precharging and determining comprises a read delay interval; and
the testing bus has a bus capacitance which is sufficient to store the precharge logic state during the read delay interval.

26. A method according to claim 25, wherein:
the test terminal is a two-state input/output test terminal;
the step of precharging comprises setting the test terminal to produce a voltage corresponding to precharge logic state before the step of producing the test signal state.

27. A method according to claim 25, wherein the testing bus is biased toward a logic state and wherein the bus capacitance is sufficient to overcome the biasing and to store the precharge logic state on the testing bus during the read delay interval.

* * * * *